(12) United States Patent
Nakahara

(10) Patent No.: US 9,530,671 B2
(45) Date of Patent: Dec. 27, 2016

(54) ETCHING METHOD

(71) Applicant: Tokyo Electron Limited, Tokyo (JP)

(72) Inventor: Yoichi Nakahara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/779,670

(22) PCT Filed: Apr. 22, 2014

(86) PCT No.: PCT/JP2014/061323
§ 371 (c)(1),
(2) Date: Sep. 24, 2015

(87) PCT Pub. No.: WO2014/175279
PCT Pub. Date: Oct. 30, 2014

(65) Prior Publication Data
US 2016/0049314 A1    Feb. 18, 2016

(30) Foreign Application Priority Data

Apr. 26, 2013  (JP) ................................ 2013-093865

(51) Int. Cl.
*H01L 21/311*     (2006.01)
*H01L 21/3213*    (2006.01)
(Continued)

(52) U.S. Cl.
CPC ... *H01L 21/32137* (2013.01); *H01J 37/32082* (2013.01); *H01J 37/32165* (2013.01);
(Continued)

(58) Field of Classification Search
CPC .......... H01L 21/32137; H01L 21/0337; H01L 21/31144; H01L 21/32055; H01J 37/3208; H01J 37/32165
(Continued)

(56) References Cited

U.S. PATENT DOCUMENTS

| 7,718,538 B2 * | 5/2010 | Kim .......................... C23F 4/00 216/58 |
| 2002/0052111 A1 * | 5/2002 | Paterson ............... H01J 37/321 438/689 |
| 2009/0087990 A1 * | 4/2009 | Yatsuda .............. H01L 21/0337 438/694 |

FOREIGN PATENT DOCUMENTS

| JP | 2000-058292 | 2/2000 |
| JP | 2002-050611 | 2/2002 |

(Continued)

*Primary Examiner* — Duy Deo
*Assistant Examiner* — Maki Angadi
(74) *Attorney, Agent, or Firm* — Ipusa, PLLC

(57) ABSTRACT

An etching method for etching an object to be processed in a processing chamber including a first electrode and a second electrode disposed facing the first electrode and configured to receive the object to be processed thereon is provided that includes steps of intermittently supplying first high frequency power to either the first electrode or the second electrode while supplying second high frequency power lower than the first high frequency power to the second electrode, supplying a process gas containing hydrogen bromide HBr and oxygen $O_2$ into the processing chamber, and etching a poly silicon film deposited on the object to be processed into a mask pattern of a silicon-containing oxide film patterned by a spacer double patterning method by plasma generated from the process gas.

3 Claims, 8 Drawing Sheets

(51) Int. Cl.
  *H01L 21/033*     (2006.01)
  *H01J 37/32*      (2006.01)
  *H01L 21/3205*    (2006.01)

(52) U.S. Cl.
  CPC .... *H01L 21/0337* (2013.01); *H01L 21/32055* (2013.01); *H01L 21/32138* (2013.01); *H01L 21/32139* (2013.01)

(58) Field of Classification Search
  USPC .............................. 438/690–694; 216/37, 67
  See application file for complete search history.

(56) References Cited

FOREIGN PATENT DOCUMENTS

| | | |
|---|---|---|
| JP | 2009-099938 | 5/2009 |
| JP | 2010-519758 | 6/2010 |
| JP | 2012-178378 | 9/2012 |
| WO | 2008/103456 | 8/2008 |

\* cited by examiner

FIG.3

| PROCESS | AFTER MAIN ETCHING (ME) | AFTER OVER ETCHING (OE) | | |
|---|---|---|---|---|
| | | CONDITION 1 | CONDITION 2 | CONDITION 3 |
| Gas | $HBr/CHF_3/O_2$ =360/11/3sccm | $HBr/CHF_3/O_2$ =360/11/3sccm | $HBr/CHF_3/O_2$ =180/0/3sccm | $HBr/CHF_3/O_2$ =300/11/5sccm |
| HF/LF | 400/100W | 400/100W | 400/100W | 400/50W |
| CENTRAL PATTERN (Cell) | R_Ox:26.0nm | R_Ox:17.1nm | CLOSING OF MASK R_Ox:19.5nm | CLOSING OF MASK R_Ox:22.6nm |

ETCHING METHOD

TECHNICAL FIELD

The present invention relates to an etching method.

BACKGROUND ART

A spacer double patterning method is known as a method of efficiently forming a fine pattern with a high degree of accuracy (for example, see Patent Document 1). In the spacer double patterning method, for example, after depositing a predetermined film on a semiconductor wafer on which a film to be etched and a line-patterned layer is already deposited, the line-patterned layer is removed and the predetermined film other than side walls of the line-patterned layer is removed by an etching. The film to be etched is etched by using the remaining predetermined film as a mask.

PRIOR ART DOCUMENTS

Patent Documents

Patent Document 1: Japanese Laid-Open Patent Application Publication No. 2012-178378

SUMMARY OF THE INVENTION

Problem To Be Solved by the Invention

However, tips of the mask formed by the spacer double patterning method are formed into slanted shapes like crab claws. Due to this, the mask formed by the spacer double patterning method needs to have mask selectivity greater than that of a mask having a pattern with flat tips and to be prevented from being removed up to the tips.

Therefore, it is proposed that the mask selectivity is improved by supplying a gas with a depositing property when etching the film to be etched so as to produce a reaction product in the etching. However, the reaction product deposits on the side walls of the mask and causes the closing of the mask (block of an opening of the mask). In other words, it can be said that enhancing the selectivity of the mask and preventing the closing of the mask have a trade-off relationship with each other.

In response to the above matters, one embodiment of the present invention aims to provide an etching method that can improve mask selectivity and prevent closing of a mask.

Means for Solving the Problem

According to an embodiment of the present invention, there is provided an etching method for etching an object to be processed in a processing chamber including a first electrode and a second electrode disposed facing the first electrode and configured to receive the object to be processed thereon, including steps of intermittently supplying first high frequency power to either the first electrode or the second electrode while supplying second high frequency power lower than the first high frequency power to the second electrode, supplying a process gas containing hydrogen bromide HBr and oxygen $O_2$ into the processing chamber, and etching a poly silicon film deposited on the object to be processed into a mask pattern of a silicon-containing oxide film patterned by a spacer double patterning method by plasma generated from the process gas.

Advantageous Effect of the Invention

According to an embodiment of the present invention, an etching shape of an etched film can be improved by enhancing mask selectivity and preventing closing of a mask.

BRIEF DESCRIPTION OF THE DRAWINGS

FIG. 3 is a diagram for explaining a trade-off between mask selectivity and closing of a mask in an etching process;

EMBODIMENTS FOR IMPLEMENTING THE INVENTION

Figure 1:
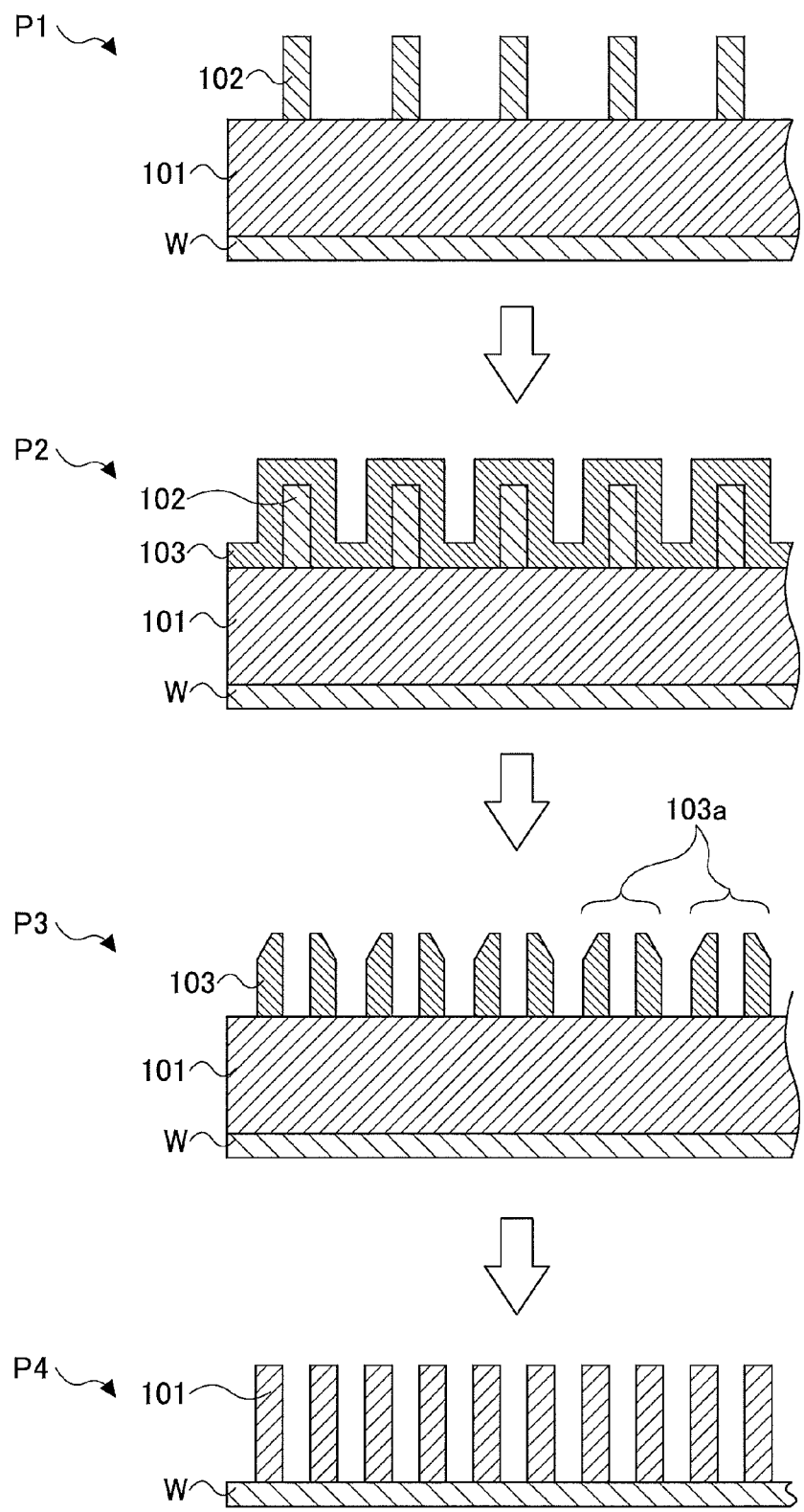
FIG. 1 is a diagram illustrating an example of an etching process by a spacer double patterning method according to an embodiment.

In the following, embodiments of the present invention are described with reference to the accompanying drawings. Note that elements having substantially the same functions or features may be given the same reference numerals and overlapping descriptions thereof may be omitted.

[Etching 1 by Spacer Double Patterning Method]

Figure 2:
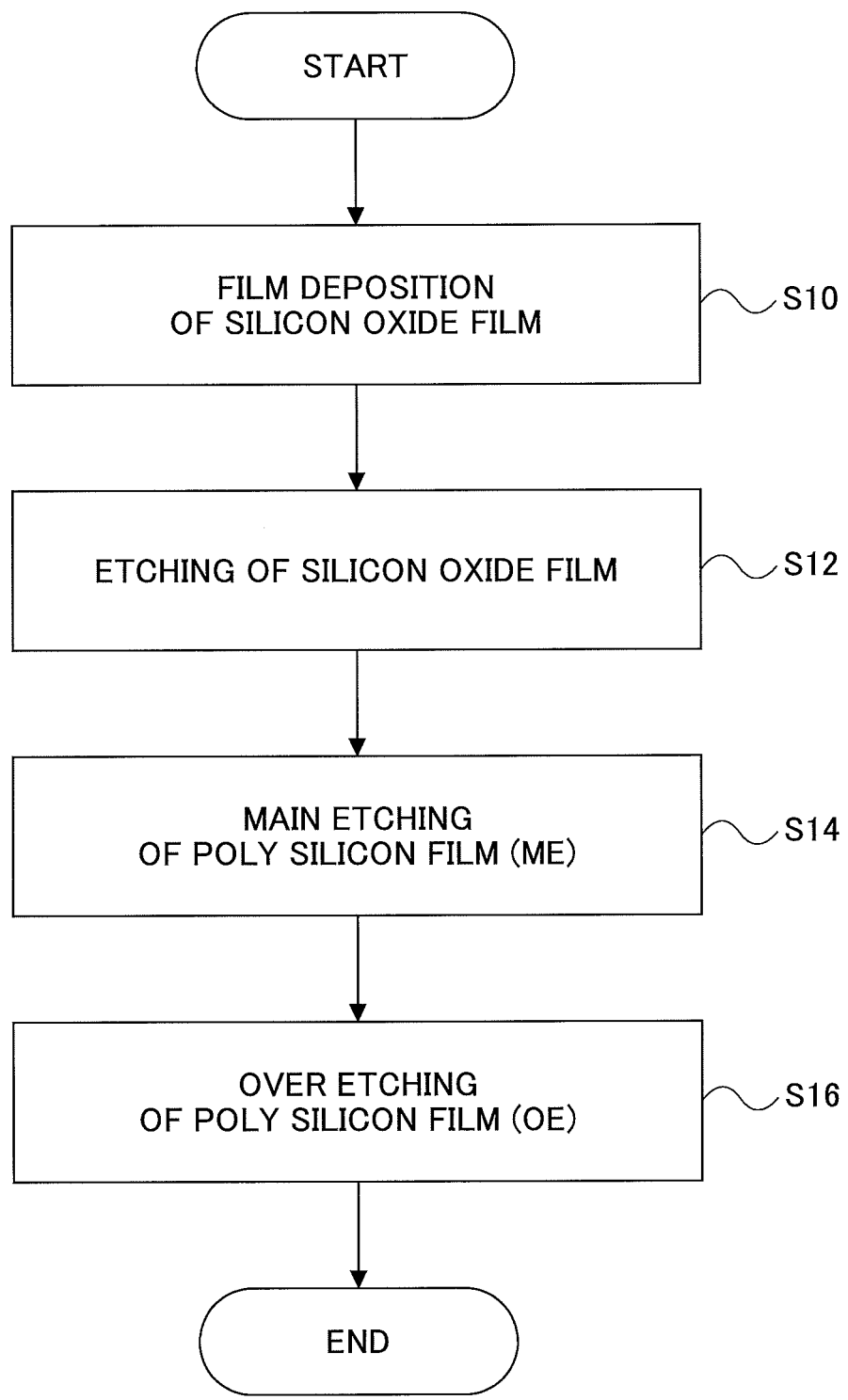
FIG. 2 is a flowchart illustrating an example of an etching process by the spacer double patterning method according to an embodiment.

To begin with, a description is given below of an etching 1 by a spacer double patterning method according to an embodiment of the present invention with reference to FIGS. 1 and 2. FIG. 1 is a diagram illustrating an etching process by the spacer double patterning method according to an embodiment. FIG. 2 is a flowchart illustrating an etching process by the spacer double patterning method according to an embodiment.

A film to be etched by the etching by the spacer double patterning method is a poly silicon film. In a process P1 in FIG. 1, a poly silicon film 101 is deposited on a semiconductor wafer (which is hereinafter just referred to as a "wafer W"). A silicon oxide film ($SiO_2$) 102 having a line pattern formed therein is deposited on the poly silicon film 101. Here, the silicon oxide film 102 is an example of a mask made of a silicon-containing oxide film ($SiO_x$).

Moreover, a breakthrough (BT) process is performed before a main etching (ME: Main Etching) process and an over etching (OE: Over Etching) process, thereby removing a natural oxide film formed on the poly silicon film 101. Process conditions in the breakthrough process are as shown in the following.

<Breakthrough (BT) Process: Process Conditions>

| | |
|---|---|
| Pressure | 10 mTorr; |
| High Frequency Power | HF (for Plasma Excitation)/ LF (for Bias) 250/100 W; and |
| Gas Type/Gas Flow Rate | Methane TetraFluoride $CF_4$ = 100 sccm. |

After the above breakthrough process, as illustrated at step S10 in FIG. 2, a silicon oxide film 103 is deposited on the wafer W.

As a result of the film deposition of step S10, as illustrated at a process P2 in FIG. 1, a silicon oxide film 103 is deposited on the poly silicon film 101 and the silicon oxide film 102.

Next, as illustrated at step S12 of FIG. 2, the silicon oxide films 102 and 103 are etched. In this etching process, the silicon oxide film 102, and the silicon oxide film 103 other than the side wall portions deposited on the silicon oxide film 102 is removed, and as illustrated at a process P3 in FIG. 1, the silicon oxide film 103 that becomes a spacer remains. The silicon oxide film 103 functions as a mask for a line pattern. Thus, the tips of the silicon oxide films 103 formed by the spacer double patterning method have slanted shapes 103a like crab claws.

Subsequently, as illustrated at step S14 in FIG. 2, a main etching (ME) is performed on the poly silicon film 101, and after that, as illustrated at step S16, an over etching (OE) is performed on the poly silicon film 101. Process conditions in the main etching process and the over etching process are as shown in the following.

<Main Etching (ME) Process: Process Conditions>

| | |
|---|---|
| Pressure | 15 mTorr; |
| High Frequency Power and | HF/LF 400/100 W; |
| Gas Type/Gas Flow Rate | Hydrogen Bromide HBr/ Fluoroform $CHF_3$/Oxygen $O_2$ = 360/11/3 sccm. |

<Over Etching (OE) Process Conditions>

| | |
|---|---|
| Pressure | 15 mTorr; |
| High Frequency Power and | HF/LF 400/100 W; |
| Gas Type/Gas Flow Rate | $HBr/CHF_3/O_2$ = 360/11/ 3 sccm. |

According to the spacer double patterning method described above, as illustrated at a process P4 in FIG. 1, the poly silicon film 101 is etched into the line pattern of the silicon oxide film 103. The pattern of the poly silicon film 101 becomes reduced in size to be equal to half of the pattern of the silicon oxide film 102.

As described above, the tips of the silicon oxide film 103 formed by the spacer double patterning method are inclined having the crab claw shapes 103a. Because of this, the mask formed by the spacer double patterning method needs to have the mask selectivity greater than that of a mask having a pattern with flat tips and to be prevented from being consumed up to the tips of the mask.

[Etching 2 by Spacer Double Patterning Method]

Therefore, in an etching 2 by the spacer double patterning method described below, the proportion of various gases were changed when over-etching the poly silicon film 101 in order to improve the selectivity of mask. Process conditions in the main etching process and the over etching process in the etching 2 were as shown in the following.

<Main Etching (ME) Process: Process Conditions>

| | |
|---|---|
| Pressure | 15 mTorr; |
| High Frequency Power and | HF/LF 400/100 W; |
| Gas Type/Gas Flow Rate | $HBr/CHF_3/O_2$ = 360/11/ 3 sccm. |

<Over Etching (OE) Process: Process Conditions>

(Condition 1) The process condition is the same as the main etching.
(Condition 2) The process condition differs in only gas proportion from the main etching as follows:

| | |
|---|---|
| Gas Type/Gas Flow Rate | $HBr/CHF_3/O_2$ = 180/0/ 3 sccm. |

(Condition 3) The process condition differs in high frequency power and gas proportion from the main etching as follows:

| | |
|---|---|
| High Frequency Power and | HF/LF 400/50 W; |
| Gas Type/Gas Flow Rate | $HBr/CHF_3/O_2$ = 180/11/ 5 sccm. |

FIG. 3 shows a result of the etching performed under the above-mentioned process conditions (conditions 1, 2 and 3). FIG. 3 shows SEM images of a circuit pattern at the central part (memory cells of a DRAM) after the main etching process and circuit patterns at the central part after the over etching (condition 1, condition 2, and condition 3) from the left in this order.

The remaining amount (R_Ox) of the silicon oxide film 103 after the main etching process was 26.0 nm. Compared to this, looking at the SEM image under the condition 1 (second from the left) in which the over etching process was performed under the same process conditions as the main etching process, the remaining amount (R_Ox) of the silicon oxide film 103 was 17.1 nm. As discussed above, because the tips of the silicon oxide film 103 are formed into the slanted shapes 103a like crab claws, a height of the silicon oxide film 103 of the tips needs to be equal to or higher than 20 nm. Hence, it is noted that the remaining amount of mask becomes insufficient when the over etching process is performed under the same process conditions as those of the main etching process.

Next, looking at the SEM image of a result of the over etching process performed under the process conditions of the condition 2 (third from the left), it is noted that the remaining amount (R_Ox) of the silicon oxide film 103 became 19.5 nm and that the mask selectivity was improved.

Furthermore, looking at the SEM image (the right end) of a result of having performed the over etching process under the process conditions of the condition 3, it is noted that the remaining amount (R_Ox) of the silicon oxide film 103 became 22.6 nm and that the mask selectivity was further improved.

As a result, it is noted that hydrogen bromide HBr and oxygen $O_2$ contribute to the improvement of the mask and that a deposition of a reaction product increases and the mask selectivity improves when a ratio of oxygen $O_2$ to hydrogen bromide HBr is increased. Moreover, it is also noted that the mask selectivity is enhanced when the high frequency power for bias (LF) is decreased because the collision of ions decreases.

However, in the conditions 2 and 3, the closing of the mask (block of the opening of the mask) occurred. Thus, when supplying the process gas while increasing the percentage of the gas having a deposition property, the reaction product deposits on the side walls of the mask, which could cause the closing of the mask. In other words, improving the mask selectivity and preventing the closing of the mask have a trade-off relationship with each other.

A description is given below of a first embodiment and a second embodiment in this order, with respect to an etching method capable of increasing mask selectivity and preventing closing of a mask, thereby improving an etching shape of an etched film.

First Embodiment

Etching Method

The etching by the spacer double patterning method illustrated in FIGS. 1 and 2 is also performed in the etching method of the first embodiment. In addition, in the etching method of the present embodiment, the high frequency power (HF: for plasma excitation) is supplied intermittently, that is to say, in a pulse form in the main etching process and the over etching process.

Figure 4:
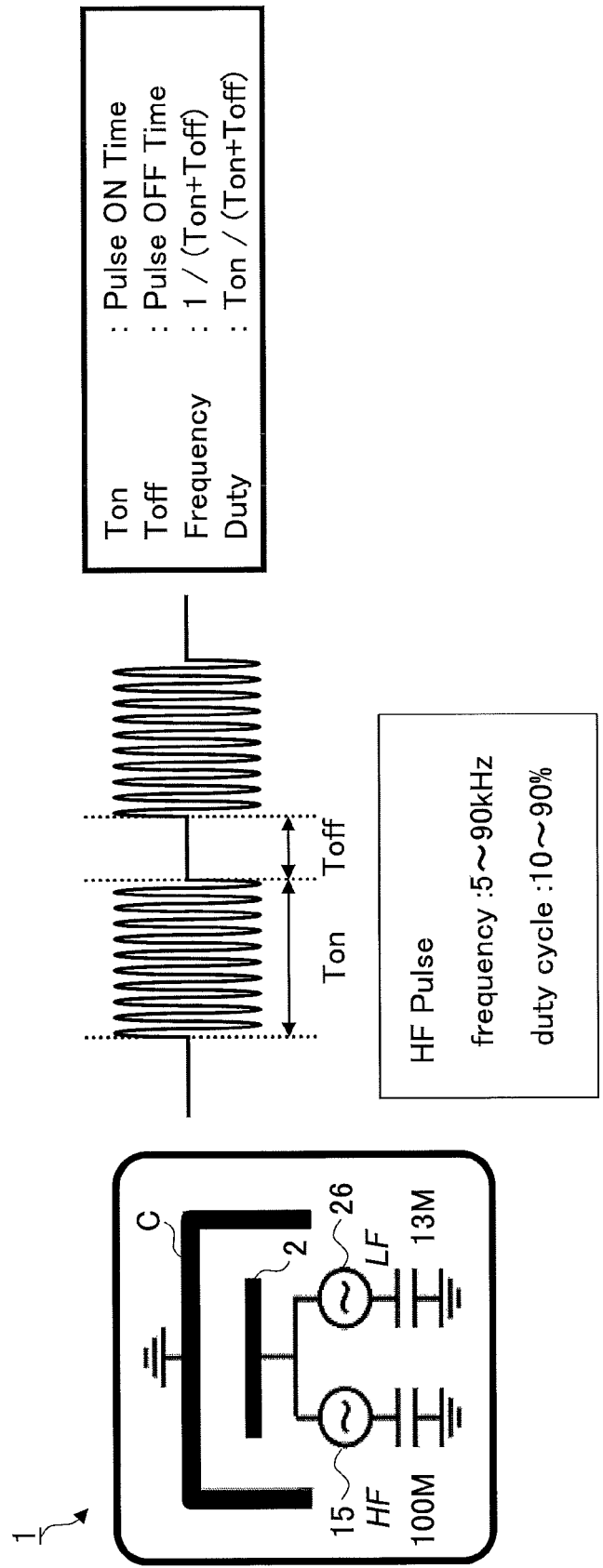
FIG. 4 is a diagram for explaining a definition of intermittent supply of high frequency power according to an embodiment.

The etching method of the first embodiment was performed by using a capacitively-coupled plasma etching apparatus that generates plasma by supplying the high frequency power to an upper electrode and a lower electrode. FIG. 4 schematically illustrates the capacitively-coupled plasma etching apparatus 1 according to an embodiment. A first high frequency power source 15 provided in the capacitively-coupled plasma apparatus 1 intermittently supplies the high frequency power of 100 MHz (HF: corresponding to the first high frequency power source) to a pedestal 2 in a chamber C (processing chamber) in the main etching process and the over etching process. The pedestal 2 also functions as the lower electrode.

As illustrated in FIG. 4, when the high frequency power is intermittently supplied, a period of time when the high frequency power (HF) is supplied is expressed by Ton, and a period of time when the high frequency power (HF) is not supplied is expressed by Toff. During the period of time when the high frequency power is supplied Ton, the pulsed high frequency power (HF) of a frequency of 1/(Ton+Toff) is supplied to the lower electrode. The frequency of 1/(Ton+Toff) is in a range of 5 kHz to 90 kHz.

A duty ratio is expressed by a ratio of the period of time Ton to the total period of time of the period of time Ton when the high frequency power is supplied and the period of time Toff when the high frequency power is not supplied, that is to say, Ton/(Ton+Toff). The duty ratio is 10% to 90%.

Here, the high frequency power (HF) may be supplied to the lower electrode or to the upper electrode. The second high frequency power source 26 supplies the high frequency power of 13.4 MHz (LF: corresponding to the second high frequency power) to the lower electrode as a continuous wave.

Each of the breakthrough process, the main etching process and the over etching process performed in the first embodiment is as shown in the following.

<Breakthrough (BT) Process: Process Conditions>

| | |
|---|---|
| Pressure | 10 mTorr; |
| High Frequency Power source | HF/LF 250/100 W; |
| | HF Continuous Supply; |
| | LF Continuous Supply; |
| and | |
| Gas Type/Gas Flow Rate | CF$_4$ = 100 sccm. |

<Main Etching (ME) Process: Process Conditions>

| | |
|---|---|
| Pressure | 15 mTorr; |
| High Frequency Power source | HF/LF 800/100 W; |
| | HF Intermittently Supply, frequency 50 Hz, Duty Ratio 50%; |
| | LF Continuous Supply; |
| and | |
| Gas Type/Gas Flow Rate | HBr/CHF$_3$/O$_2$ (+ O$_2$ added) = 360/11/3 (3) sccm. |

<Over Etching (OE) Process: Process Conditions>

The conditions are the same as the process conditions of the main etching process.

In contrast, in an etching method of a comparative example 1, the high frequency power (HF) is continuously supplied. The process conditions on this occasion are shown in the following. Here, process conditions in the comparative example 1 are set at approximately the same as the process conditions of the present embodiment including the high frequency power and the like.

<Breakthrough (BT) Process: Process Conditions of Comparative Example 1>

| | |
|---|---|
| Pressure | 10 mTorr; |
| High Frequency Power source | HF/LF 250/100 W; |
| | HF Continuous Supply; |
| | LF Continuous Supply; |
| and | |
| Gas Type/Gas Flow Rate | CF$_4$ = 100 sccm. |

<Main Etching (ME) Process: Process Conditions of Comparative Example 1>

| | |
|---|---|
| Pressure | 15 mTorr; |
| High Frequency Power source | HF/LF 400/100 W; |
| | HF Continuous Supply; |
| | LF Continuous Supply; |
| and | |
| Gas Type/Gas Flow Rate | HBr/CHF$_3$/O$_2$ = 360/11/3 sccm. |

<Over Etching (OE) Process: Process Conditions of Comparative Example 1>

The process conditions are the same as the process conditions of the main etching process.

(Etching Result)

Figure 5:
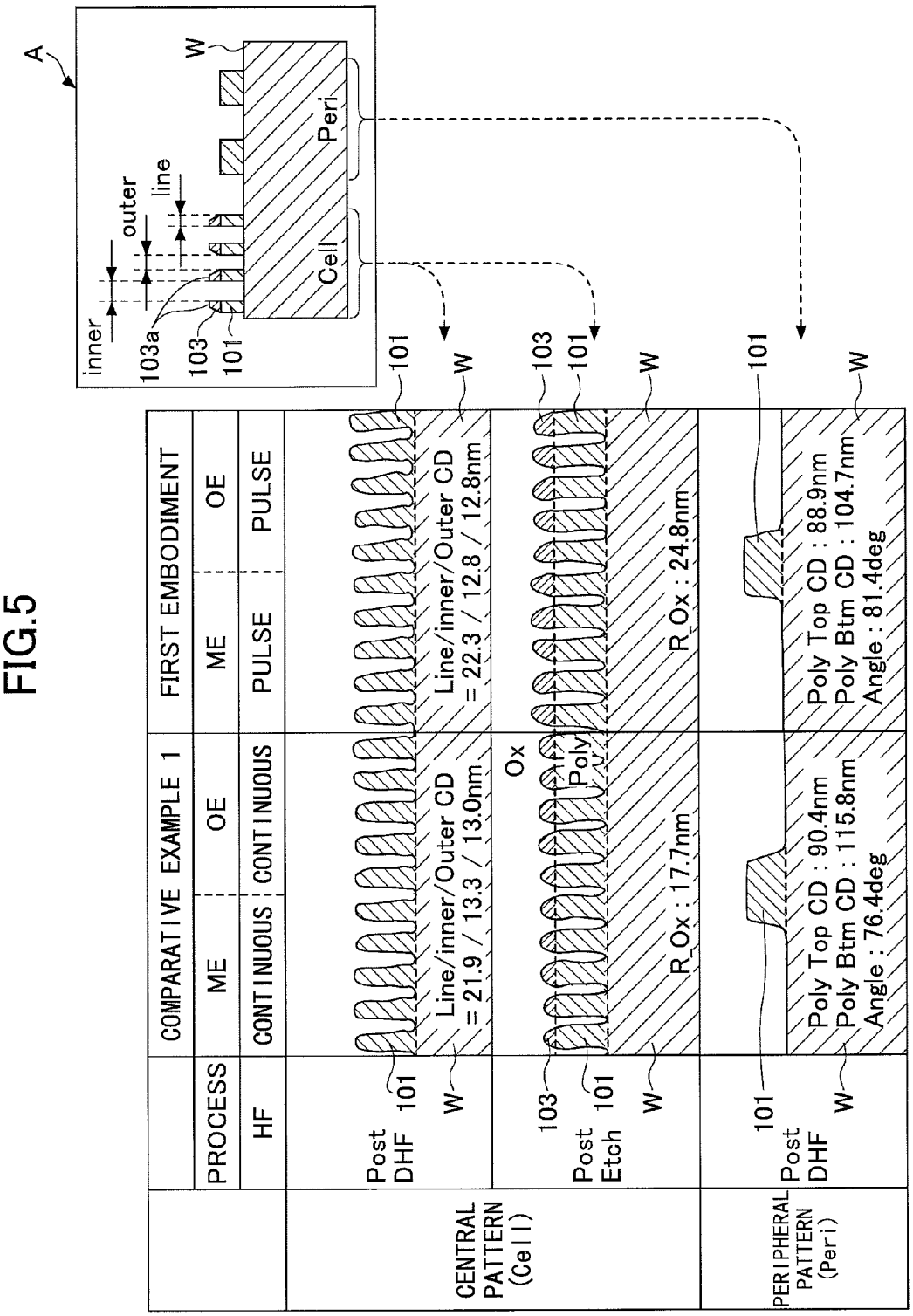
FIG. 5 is a diagram illustrating an example of a result of etching by an etching method according to a first embodiment.

FIG. 5 shows a result of etching of the poly silicon film 101 by the spacer double patterning method using the etching method of the first embodiment and the etching method of the comparative example 1. The left column in FIG. 5 shows a result of the case of using the etching method of the comparative example 1, that is to say, the case of continuously supplying the high frequency power (HF) in the main etching process and the over etching process. The right column in FIG. 5 shows a result of the case of using the etching method of the first embodiment, that is to say, the case of intermittently supplying the high frequency power (HF) in the main etching process and the over etching process.

FIG. 5 shows SEM images of circuit patterns at the central part (Cell) and SEM images of circuit patterns at the peripheral part (Peri) of a memory of a DRAM after the etching.

As shown in a frame A on the right of FIG. 5, the central circuit pattern (Cell) in the memory of DRAM differs in shape from the peripheral circuit pattern (Peri) thereof. The central circuit pattern is formed by etching the poly silicon film 101 while covering the poly silicon film 101 with the silicon oxide films 103a having the slanted shapes 103a like crab claws as a mask. Here, a distance between inner surfaces of the slanted shapes 103a of the crab claws of the tips of the silicon oxide films (a distance between portions having the steepest slope located at the tips of the silicon oxide films 103) is expressed by an inner CD (Inner). A distance between outer surfaces of the slanted shapes 103a of the crab claws (a distance between portions having the mildest slope of the tips) is expressed by an outer CD (Outer). The width of the bottom of the silicon oxide film 103 is expressed by a line (Line).

A SEM image of "Post Etch" of the central circuit pattern (Cell) shows a remaining amount (R_Ox) of the silicon oxide film 103 after the over etching process. According to this, in the comparative example 1, a remaining amount (R_Ox) of the silicon oxide film 103 was 17.7 nm. In the above process conditions, a targeted remaining amount of the silicon oxide film 103 is equal to or thicker than 20 nm. In the comparative example 1, the remaining amount (R_Ox) of the silicon oxide film 103 is smaller than 20 nm, which indicates that the mask selectivity is insufficient.

In contrast, in the present embodiment having intermittently supplied the high frequency power (HF) in the main etching process and the over etching process, a remaining amount (R_Ox) of the silicon oxide film 103 was 24.8 nm. Hence, in the first embodiment, it is noted that sufficient mask selectivity beyond the targeted remaining amount of 20 nm could be obtained. Here, the remaining amount (R_Ox) of the silicon oxide film 103 means a height of the highest portion of the slanted shape 103a like a carb claw from the bottom of the silicon oxide film 103.

A SEM image of "Post DHF" of the central circuit pattern (Cell) is an image after removing the silicon oxide film 103 (mask) subject to the over etching process by hydrofluoric acid cleaning, and shows only a shape of the poly silicon film 101 on the wafer W. According to this, in the comparative example 1, the line (Line), the inner (Inner), and the outer (Outer) of the poly silicon film 101 were 21.9 nm, 13.3 nm, and 13.0 nm, respectively. In contrast, in the first embodiment, the line (Line), the inner (Inner), and the outer (Outer) were 22.3 nm, 12.8 nm, and 12.8 nm, respectively.

From this result, in the etching result of the comparative example 1 and the first embodiment, it is noted that any values in the line, the inner and the outer hardly change. In other words, the etching shapes hardly change in both of the comparative example 1 and the first embodiment. As discussed above, according to the etching method of the first embodiment, the etching shape is preferable and the mask selectivity can be improved.

With respect to the peripheral circuit pattern (Peri), comparing the SEM image of the first embodiment with the SEM image of the comparative example 1, when an angle of the etching shape in the vertical direction is made 90 degrees, an angle (Angle) of the etching shape was 76.4 degrees in the comparative example 1. In contrast, an angle (Angle) was 81.3 degrees in the first embodiment. Accordingly, the etching side wall of the first embodiment becomes more vertical than the side wall of the comparative example 1, which indicates that the etching shape is preferable.

In the etching method according to the first embodiment, it is thought that the mask selectivity became high and that the etching shape became excellent while preventing the closing of the mask due to the following 1 through 3 effects obtained by intermittently supplying the high frequency power (HF).

1. Effect of Exhausting Reaction Product

Because an electron temperature of plasma increases during the period of time when the high frequency power (HF) is supplied (Ton), the electrolytic disassociation and the disaggregation are urged and the density of plasma increases. This urges the etching, and a reaction product deposits on the etching surface. In contrast, because the electron temperature of the plasma decreases during the period of time when the high frequency power is not supplied (Toff), radicals in the plasma can be controlled in a predetermined state. This allows the reaction product deposited on the etching surface of the poly silicon film 103 to have a reaction by an action of the radicals so as to be exhausted.

2. Effect of Canceling Charge

Because electrons collide with the etched side walls of the poly silicon film 103 as the etching progresses and an aspect ratio (AR: Aspect Ratio) increases, the number of electrons reaching the bottom decreases. In contrast, many of ions enter the etched pattern of the poly silicon film 103 approximately perpendicular thereto and reach the bottom. This causes positive charge to accumulate on the bottom of the etched pattern of the poly silicon 103. Thus, when the bottom of the etching pattern is charged up, the subsequent incident ions act repulsively from the bottom of the etching pattern, are bounced back and collide with the side walls of the poly silicon film 103, which causes a shape abnormality such as a notch and the like. This is the charge damage. In contrast, during the period of time when the high frequency power is not supplied (Toff), the ion sheath disappears, and negative ions and electrons are attracted to the bottom of the etching pattern of the poly silicon film 103 by the high frequency power (LF: for bias) supplied to the lower electrode, and the charge of the bottom can be canceled.

3. Effect of Decreasing Electron Temperature of Plasma and Controlling Dissociation of Gas When the high frequency power (HF) is continuously supplied so as to keep generating the plasma, the electron temperature of the plasma increases. In contrast, when the high frequency power (HF) is intermittently supplied, the plasma is refreshed and the density of plasma decreases during the period of time when the high frequency power (HF) is not supplied (Toff). In other words, during the period of time when the high frequency power (HF) is not supplied, the electron temperature of plasma decreases, and the dissociation of the gas can be controlled, such as controlling the radicals in the plasma to go into a predetermined state.

Here, in addition to the case of intermittently supplying the high frequency power (HF) to the lower electrode, the above effects of 1 through 3 can be obtained in the case of intermittently supplying the high frequency power (HF) to the upper electrode.

As described above, according to the etching method of the present embodiment, the closing of the mask can be prevented while improving the mask selectivity of the silicon oxide film 101, thereby improving the etching shape of the poly silicon film 103 due to the above-mentioned effects. In other words, the mask selectivity can be improved without causing the trade-off with respect to three factors of the mask selectivity, the closing of mask, and the etching shape of the poly silicon film 101.

In the etching method of the present embodiment, the percentage of a flow rate of oxygen $O_2$ to the total flow rate of hydrogen bromide HBr and oxygen $O_2$ contained in a process gas ($=O_2/(HBr+O_2)$) is preferably in a range of 0.3% to 5%. It is hydrogen bromide HBr and oxygen $O_2$ that contributes to the improvement of the mask selectivity. Moreover, when the ratio of oxygen $O_2$ to hydrogen bromide HBr is increased, the deposition of the reaction product increases and the mask selectivity improves. Accordingly, the process gas needs to contain not only hydrogen bromide HBr but also oxygen $O_2$, and the percentage is preferred to be equal to or more than 0.3%. On the other hand, the higher the percentage of the flow rate of oxygen $O_2$ to the total flow rate of hydrogen bromide HBr and oxygen $O_2$ becomes, the more greatly the mask selectivity improves. However, when the flow rate percentage of oxygen $O_2$ is too high, the closing of mask occurs. Accordingly, the percentage of the flow rate of oxygen $O_2$ is preferred to be set at 5% or lower to prevent the closing of the mask.

Second Embodiment

Etching Method

The etching by the spacer double patterning method illustrated in FIGS. 1 and 2 is also performed in an etching method according to a second embodiment. In addition, in the present embodiment, the first high frequency power source 15 illustrated in FIG. 4 intermittently supplies high frequency power (HF) of 100 MHz to the lower electrode in the over etching process, and continuously supplies the high frequency power (HF) of 100 MHz in the main etching process.

The high frequency power (HF) may be supplied to the lower electrode or to the upper electrode as well as the first embodiment. Moreover, the second high frequency power source 26 continuously supplies high frequency power (LF) of 13.4 MHz to the lower electrode.

Process conditions of the breakthrough process, the main etching process and the over etching process performed in the etching method according to the second embodiment of intermittently supplying the high frequency power (HF) only in the over etching process are shown in the following.

<Breakthrough (BT) Process: Process Conditions>

| Pressure | 10 mTorr; |
|---|---|
| High Frequency Power source | HF/LF 250/100 W; |
| | HF Continuous Supply; |
| | LF Continuous Supply; |
| and | |
| Gas Type/Gas Flow Rate | $CF_4$ = 100 sccm. |

<Main Etching (ME) Process: Process Conditions>

| Pressure | 15 mTorr; |
|---|---|
| High Frequency Power source | HF/LF 400/150 W; |
| | HF Continuous Supply; |
| | LF Continuous Supply; |
| and | |
| Gas Type/Gas Flow Rate | $HBr/O_2$ = 220/5 sccm. |

<Over Etching (OE) Process: Process Conditions>

| Pressure | 15 mTorr; |
|---|---|
| High Frequency Power source | HF/LF 1200/100 W; |
| | HF Intermittently Supply, frequency 50 Hz, Duty Ratio 50%; |
| | LF Continuous Supply; |
| and | |
| Gas Type/Gas Flow Rate | $HBr/Cl_2/O_2$ = 220/50/3 sccm. |

In contrast, in an etching method of a comparative example 2, the high frequency power (HF) is continuously supplied. Process conditions on this occasion are shown in the following. Here, the process conditions of the comparative example 2 are set at approximately the same as the process conditions of the present embodiment including the high frequency power and the like.

<Breakthrough (BT) Process: Process Conditions of Comparative Example 2>

| Pressure | 10 mTorr; |
|---|---|
| High Frequency Power source | HF/LF 250/100 W; |
| | HF Continuous Supply; |
| | LF Continuous Supply; |
| and | |
| Gas Type/Gas Flow Rate | $CF_4$ = 100 sccm. |

<Main Etching (ME) Process: Process Conditions of Comparative Example 1>

| Pressure | 15 mTorr; |
|---|---|
| High Frequency Power source | HF/LF 400/150 W; |
| | HF Continuous Supply; |
| | LF Continuous Supply; |
| and | |
| Gas Type/Gas Flow Rate | $HBr/(+ O_2$ added) = 270/(5) sccm. |

<Over Etching (OE) Process: Process Conditions of Comparative Example 2>

| Pressure | 15 mTorr; |
|---|---|
| High Frequency Power source | HF/LF 400/100 W; |
| | HF Continuous Supply; |
| | LF Continuous Supply; |
| and | |
| Gas Type/Gas Flow Rate | $HBr/Cl_2/O_2$ = 220/50/3 sccm. |

(Etching Result)

Figure 6:
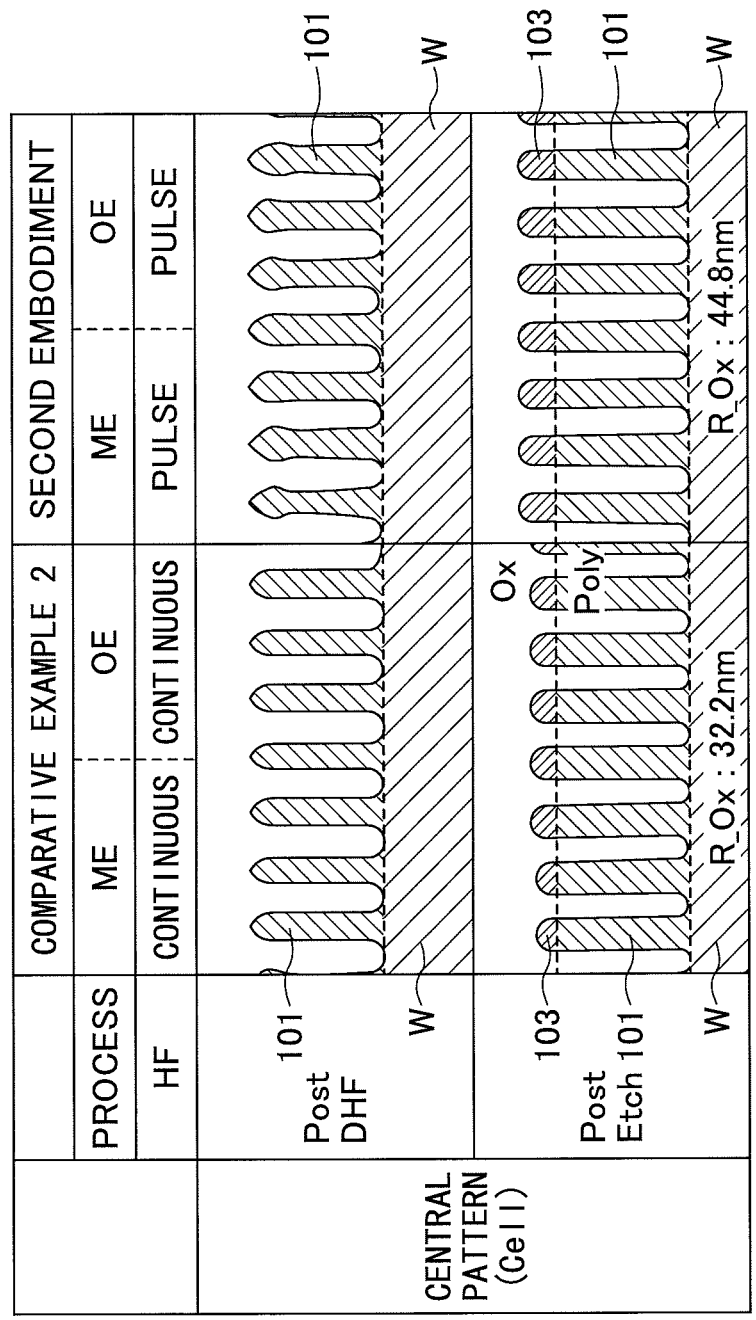
FIG. 6 is a diagram illustrating an example of a result of etching by an etching method according to a second embodiment.

FIG. 6 shows a result of etching of the poly silicon film 101 by the spacer double patterning method using the etching method of the second embodiment and the etching method of the comparative example 2. The left column in FIG. 6 shows a result of the case of using the etching method of the comparative example 2, that is to say, the case of continuously supplying the high frequency power (HF) in the main etching process and the over etching process. The right column in FIG. 6 shows a result of the case of using the etching method of the second embodiment, that is to say, the case of continuously supplying the high frequency power (HF) in the main etching process and intermittently supplying the high frequency power (HF) in the over etching process.

FIG. 6 shows SEM images of circuit patterns at the central part (Cell) of a memory of a DRAM after the over etching. A SEM image of "Post DHF" of the central circuit pattern (Cell) shows only a shape of the poly silicon film 101 on the wafer W after removing the silicon oxide film 103 (mask) after the over etching process. According to this, the comparative example 2.

A SEM image of "Post Etch" at the central circuit pattern (Cell) shows a remaining amount of the silicon oxide film 103 after the over etching process. According to this, in the comparative example 2, the remaining amount (R_Ox) of the silicon oxide film 103 was 32.2 nm. In the above process conditions, a targeted remaining amount of the silicon oxide film 103 is equal to or thicker than 20 nm. Here, because the second embodiment differs in process conditions from the first embodiment, a targeted remaining amount of the silicon oxide film 103 differs from 20 nm of the first embodiment.

In contrast, in the second embodiment having intermittently supplied the high frequency power (HF) in the over etching process, the remaining amount (R_Ox) of the silicon oxide film 103 was 44.8 nm, which indicates that the mask selectivity has improved better than that of the comparative example 2.

As described above, it is noted that the mask selectivity can be enhanced and the etching shape can be improved by preventing the closing of the mask even in the etching method according to the second embodiment. In particular, in the etching method of the second embodiment, the high frequency power (HF) is continuously supplied in the main etching process. Because of this, the etching rate can be increased and the poly silicon film 103 can be etched more vertically in the main etching process. This makes it possible to improve the mask selectivity and to prevent the closing of the mask in the over etching process of intermittently supplying the high frequency power (HF) while improving the throughput of the entire etching process.

Here, in the first and second embodiments, after the over etching process on the wafer W of 300 mm, a remaining amount of the silicon oxide film 103 of each area was obtained by dividing the wafer W into a center area, a middle area, an edge area, and an extra edge area (the outermost circumference) in a radial direction from the center to the outer circumference. The average value of four measurement values is shown as the remaining amount (R_Ox) of the silicon oxide film 103.

The values of the line (Line), the inner (Inner), and the outer (Outer) shown in the first and second embodiments are obtained by calculating an average value of the measurement values of selected six line patterns of the silicon oxide film 103.

[Overall Configuration of Etching Apparatus]

Figure 7:
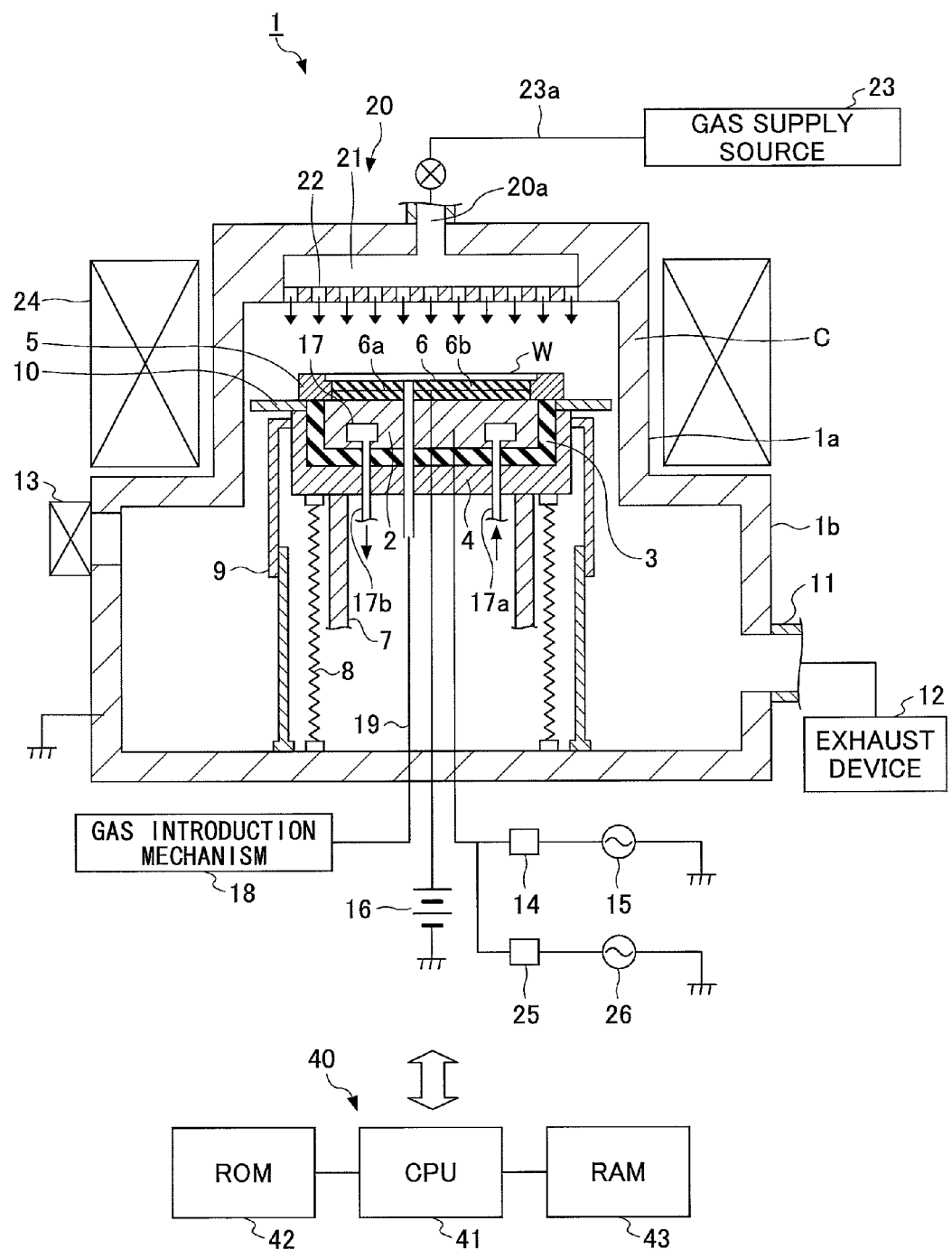
FIG. 7 is a longitudinal cross-sectional view illustrating an etching apparatus according to an embodiment.
Figure 8:
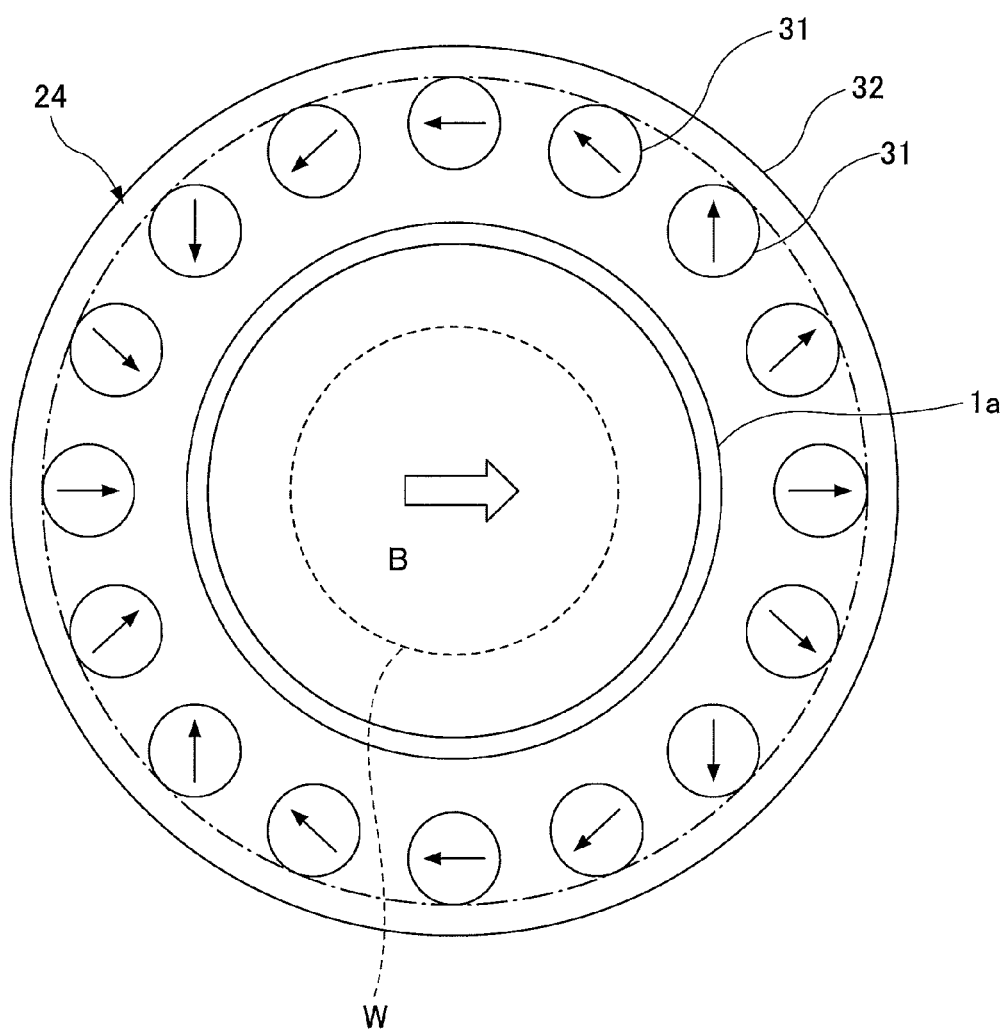
FIG. 8 is a transverse cross-sectional view illustrating a dipole ring magnet according to an embodiment.

Finally, a description is given below of an etching apparatus that performs a main etching process and an over etching process by using the etching method according to the embodiments, with reference to FIGS. 7 and 8. FIG. 7 is a longitudinal cross-sectional view illustrating an overall configuration of a capacitively-coupled plasma etching apparatus according to an embodiment. FIG. 8 is a transverse cross-sectional view illustrating a dipole ring magnet according to an embodiment.

The capacitively-coupled plasma etching apparatus 1 according to the embodiment is formed as a magnetron-reactive-ion-etching-type plasma etching apparatus. The plasma etching apparatus includes a chamber C made of metal, for example, aluminum, stainless steel or the like. For example, a pedestal 2 to receive a wafer W thereon is provided inside the chamber C. The pedestal 2 is made of, for example, aluminum, and is supported by a support 4 made of a conductor through an insulating member 3. A focus ring 5 made of, for example, silicon or quartz is arranged in a periphery on an upper surface of the pedestal 2. An electrostatic chuck 6 to hold the wafer W thereon is provided at an upper surface of the pedestal 20. The pedestal 2 and the support 4 are movable up and down by an elevating mechanism including a ball screw 7, and an elevating drive unit (not illustrated in the drawings) provided below the support 4 is covered with a bellows 8 made of stainless steel. A bellows cover 9 is provided outside the bellows 8. A lower surface of the focus ring 5 is connected to the baffle plate 10, and the focus ring 5 is electrically connected the chamber C through the baffle plate 10, the support 4 and the bellows 8. The chamber C is grounded.

The chamber C includes an upper chamber 1*a* and a lower chamber 1*b* having a diameter greater than the upper chamber. An exhaust opening 11 is formed in the side wall of the lower chamber 1*b*. An exhaust device 12 is connected to the exhaust opening 11 through an exhaust pipe. By operating a vacuum pump of the exhaust device 12, a pressure of a processing space inside the chamber C is reduced to a predetermined degree of vacuum. A gate valve 13 to open and close a transfer opening for the wafer W is attached to the side wall of the lower chamber 1*b*.

A first high frequency power source 15 for plasma generation and reactive ion etching (RIE) is electrically connected to the pedestal 2 through a matching box 14. The first high frequency power source 15 supplies high frequency power with a frequency of, for example, 100 MHz as the high frequency power for plasma generation (HF) to the pedestal 2.

A second high frequency power source 26 is electrically connected to the pedestal 2 through a matching box 25. The second high frequency power source 26 supplies high frequency power with frequency of, for example, 13.4 MHz as the high frequency power for bias (LF) to the pedestal 2 in addition to the high frequency power for plasma generation (HF).

A shower head 20 described later is provided in a ceiling part of the chamber C as an upper electrode maintained at grounded potential. Accordingly, the high frequency power (HF) is supplied from the first high frequency power source 15 to the pedestal 2 and the shower head 20.

The electrostatic chuck 6 is configured to have an electrode 6*a* made of a conductive film sandwiched between a pair of insulating sheets 6*b*. A direct voltage source 16 is connected to the electrode 6*a*. The wafer W is attracted on the electrostatic chuck 6 by an electrostatic attractive force due to the direct voltage from the direct voltage source 16.

A refrigerant chamber 17 extending, for example, in a circumferential direction is provided inside the pedestal 2. A refrigerant of a predetermined temperature such as cooling water is supplied from an external chiller unit (not illustrated in the drawings) to the refrigerant chamber 17 through pipes 17*a* and 17*b* and circulated therethough. The wafer W on the pedestal 2 is controlled so as to become a predetermined processing temperature by the temperature of the refrigerant circulating therethrough.

Furthermore, a heat transfer gas from a gas introduction mechanism 18, for example, He gas, is supplied to a space between the upper surface of the electrostatic chuck 6 and the back surface of the wafer W through a gas supply line 19. The gas introduction mechanism 18 is configured to control a gas pressure, that is to say, a back pressure, independently in a wafer central part and a wafer peripheral part in order to improve uniformity of the etching process across the wafer surface.

The shower head 20 at the ceiling part has many gas discharge holes 22 in a lower surface facing the upper surface of the pedestal 2 in parallel with each other. A buffer chamber 21 is provided inside the gas discharge holes. A gas supply source 23 is connected to a gas introduction port 20a through a gas supply pipe 23a. A process gas is supplied from the gas supply source 23.

A dipole ring magnet 24 extending annularly or concentrically is disposed around the upper chamber 1a. As illustrated in a transverse cross-sectional view of FIG. 8, the dipole ring magnet 24 is formed by arranging a plurality of, for example, 16 anisotropic segmental cylindrical magnets 31 at regular intervals in the circumferential direction inside a casing 32 made of a ring-shaped magnetic body. In FIG. 8, an arrow shown in each of the anisotropic segmental cylindrical magnets 31 indicates a direction of magnetization, and a uniform horizontal magnetic field B that heads for one direction as a whole can be formed by displacing the directions of the magnetization of the anisotropic segmental cylindrical magnets 31 little by little along the circumferential direction as illustrated in the drawing.

Accordingly, an RF electric field is formed in the vertical direction by the high frequency power from the first high frequency power source 15, and the magnetic field is formed in the horizontal direction by the dipole ring magnet 24, respectively, in a space between the pedestal 2 and the shower head 20. High-density plasma is generated in the vicinity of the surface of the pedestal 2 by a magnetron discharge using orthogonal electric and magnetic fields.

The plasma etching apparatus of the above-mentioned configuration is integrally controlled by a control unit 40. The control unit 40 includes a CPU 41 (Central Processing Unit), a ROM 42 (Read Only Memory), and a RAM 43 (Random Access Memory). The CPU 41 performs a plasma process according to various recipes stored in a memory area such as the RAM 43 and the like. The recipe specifies process time, a temperature in the processing chamber (an upper electrode temperature, a side wall temperature of the processing chamber, an ESC temperature and the like), a pressure (gas exhaustion), the high frequency power or a voltage, a flow rate of a process gas, a flow rate of a transfer gas and the like.

In the plasma etching apparatus 1 configured in this manner, to perform a plasma etching, to begin with, a wafer W is carried in the chamber C from the gate valve 13, and is placed on the pedestal 2. The wafer W to be carried in is in a state of having a silicon oxide film 103 patterned by the spacer double patterning method formed on a poly silicon film 101 on the wafer W by the process P3 in FIG. 1.

Next, the pedestal 2 receiving the wafer W is elevated up to a height position illustrated in the drawing, and the chamber C is evacuated by a vacuum pump of the exhaust device 12 through the exhaust opening 11. Then, a process gas is introduced into the chamber C from the gas supply source 23 at a predetermined flow rate, and a pressure in the chamber C is set at a setting value. Furthermore, predetermined high frequency power (HF, LF) is supplied from the first high frequency power source 15 and the second high frequency power source 26 to the pedestal 2. Moreover, a direct voltage is applied to the electrode 6a of the electrostatic chuck 6 from the direct voltage source 16, thereby fixing the wafer W on the pedestal 2. The process gas introduced from the shower head 20 ionizes or dissociates by the magnetron discharge, thereby generating plasma.

In the above first and second embodiments, the process gas containing hydrogen bromide HBr and oxygen $O_2$ is supplied from the gas supply source 23. Then, the poly silicon film 101 deposited on the wafer W is etched into a mask pattern of the silicon oxide film 103 patterned by the spacer double patterning method by the plasma generated from the process gas.

In addition, in the first and second embodiments, among the main etching process and the over etching process, in the step of intermittently supplying the first high frequency power, the process gas containing hydrogen bromide HBr and oxygen $O_2$ may further contain any one of chlorine $Cl_2$, fluoromethane $CH_3F$, and fluoroform $CHF_3$.

Moreover, in the first and second embodiments, among the main etching process and the over etching process, in the step of intermittently supplying the first high frequency power, the power of the first high frequency power source 15 may be controlled at any value in a range of 400 W to 2400 W.

Here, the shower head 20 that functions as the upper electrode corresponds to a first electrode. Moreover, the pedestal 2 corresponds to a second electrode for receiving an object to be processed. Furthermore, the high frequency power (HF) supplied to either the first electrode or the second electrode corresponds to a first high frequency power. The high frequency power lower than the first high frequency power (LF) supplied to the second electrode corresponds to a second high frequency power.

Hereinabove, although the etching method has been described according to the first and second embodiments, the etching method of the present invention is not limited to the embodiments and various modifications and improvements can be made without departing from the scope of the invention. Moreover, the embodiments and modifications can be combined as long as they are not contradictory to each other.

For example, the film deposition of the silicon oxide film 103 to be formed as the spacer can be performed by using a CVD apparatus using a radial line slot antenna, a capacitively coupled plasma (CCP: Capacitively Coupled Plasma) apparatus, an inductively coupled plasma (ICP: Inductively Coupled Plasma) apparatus, a helicon wave excited plasma (HWP: Helicon Wave Plasma) apparatus, an electron cyclotron resonance plasma (ECR: Electron Cyclotron Resonance Plasma) apparatus and the like.

Moreover, the etching of the silicon oxide films 102 and 103, and the main etching (ME) and the over etching (OE) of the poly silicon film 101 can be performed by using not only the capacitively-coupled plasma etching apparatus 1 but also a plasma apparatus using the radial line slot antenna, the inductively coupled plasma apparatus, the helicon wave excited plasma apparatus, the electron cyclotron resonance plasma apparatus and the like.

An object to be processed in the present invention is not limited to the wafer W having a diameter of 300 mm, but can be applied to a wafer of 450 mm, a substrate for a flat panel display, a substrate for an EL (electroluminescence) device or a solar cell.

The present application is based on and claims the benefit of priority of Japanese Patent Application No. 2013-093865 filed on Apr. 26, 2013, the entire contents of which are herein incorporated by reference.

DESCRIPTION OF THE REFERENCE NUMERALS 1 plasma etching apparatus
2 pedestal
15 first high frequency power source
26 second high frequency power source
40 control unit 101 poly silicon film
102 silicon oxide film
103 silicon oxide film
103a shape of crab claw

The invention claimed is:

1. An etching method for etching an object to be processed in a processing chamber including a first electrode and a second electrode disposed facing the first electrode and configured to receive the object to be processed thereon, comprising steps of:
   intermittently supplying first high frequency power to either the first electrode or the second electrode while supplying second high frequency power lower than the first high frequency power to the second electrode;
   supplying a process gas containing hydrogen bromide HBr and oxygen $O_2$ into the processing chamber; and
   etching a poly silicon film deposited on the object to be processed into a mask pattern of a silicon-containing oxide film patterned by a spacer double patterning method by plasma generated from the process gas,
   wherein the step of etching includes
      a main etching step of etching the poly silicon film into the mask pattern of the silicon-containing oxide film by the plasma generated from the process gas, and
      an over etching step of further etching the poly silicon film into the mask pattern of the silicon-containing oxide film after the main etching step,
   wherein the first high frequency power is intermittently supplied in the main etching step and the over etching step.

2. The etching method as claimed in claim 1, wherein among each of the main etching step and the over etching step, in the step of intermittently supplying the first high frequency power, the supplied process gas further contains any one of chloride $Cl_2$, fluoromethane $CH_3F$ and fluoroform $CHF_3$.

3. The etching method as claimed in claim 1, wherein a percentage of a flow rate of oxygen $O_2$ to a total flow rate of hydrogen bromide HBr and oxygen $O_2$ contained in the process gas is in a range of 0.3% to 5%.

* * * * *